(12) United States Patent
Liu (10) Patent No.: US 12,150,293 B2
(45) Date of Patent: Nov. 19, 2024

(54) BIT LINE STRUCTURE, MANUFACTURING METHOD THEREOF AND SEMICONDUCTOR MEMORY

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 617 days.

(21) Appl. No.: 17/386,765

(22) Filed: Jul. 28, 2021

(65) Prior Publication Data

US 2021/0358922 A1 Nov. 18, 2021

Related U.S. Application Data

(63) Continuation of application No. PCT/CN2021/079647, filed on Mar. 9, 2021.

(30) Foreign Application Priority Data

Mar. 25, 2020 (CN) .......................... 202010216030.1

(51) Int. Cl.
*H01L 27/108* (2006.01)
*H10B 12/00* (2023.01)

(52) U.S. Cl.
CPC ........... *H10B 12/482* (2023.02); *H10B 12/30* (2023.02)

(58) Field of Classification Search
CPC .... H10B 12/482; H10B 12/30; H10B 12/485; H01L 23/5386
See application file for complete search history.

(56) References Cited

U.S. PATENT DOCUMENTS

| 6,160,297 A | 12/2000 | Shimizu |
| 6,188,095 B1 | 2/2001 | Hieke |
| 7,087,947 B2 | 8/2006 | Lee |

(Continued)

FOREIGN PATENT DOCUMENTS

| CN | 106098690 A | 11/2016 |
| CN | 106449595 A | 2/2017 |

(Continued)

OTHER PUBLICATIONS

Partial Supplementary European Search Report in the European application No. 21774016.6, mailed on Oct. 12, 2022, 12 pgs.

(Continued)

*Primary Examiner* — Mohammed R Alam (74) *Attorney, Agent, or Firm* — Kilpatrick Townsend & Stockton LLP (57) ABSTRACT

A bit line structure, a manufacturing method thereof, and a semiconductor memory are provided. The bit line structure includes a first bit line array and a second bit line array. The first bit line array includes a plurality of first bit lines extending in a Y direction. The plurality of first bit lines have a same length and are aligned and arranged in an X direction. The second bit line array includes a plurality of second bit lines extending in the Y direction. The plurality of second bit lines have a same length and are aligned and arranged in the X direction. The first bit line array and the second bit line array are not aligned in the X direction. The X direction is perpendicular to the Y direction.

15 Claims, 8 Drawing Sheets

(56) References Cited

U.S. PATENT DOCUMENTS

| | | | |
|---|---|---|---|
| 7,184,290 B1* | 2/2007 | Lee | G11C 5/063 |
| | | | 365/72 |
| 8,811,079 B2 | 8/2014 | Fukuda et al. | |
| 9,391,080 B1 | 7/2016 | Kim et al. | |
| 9,530,780 B2 | 12/2016 | Kim et al. | |
| 10,056,404 B2 | 8/2018 | Lee | |
| 2006/0077702 A1 | 4/2006 | Sugimae | |
| 2012/0063208 A1* | 3/2012 | Koyama | G11C 11/404 |
| | | | 365/230.06 |
| 2012/0075917 A1* | 3/2012 | Takemura | H01L 27/0207 |
| | | | 365/149 |
| 2013/0194867 A1 | 8/2013 | Fukuda et al. | |
| 2016/0322367 A1 | 11/2016 | Kim et al. | |
| 2017/0040338 A1 | 2/2017 | Lee | |
| 2017/0154844 A1 | 6/2017 | Kim et al. | |
| 2018/0350833 A1 | 12/2018 | Lee et al. | |
| 2020/0111795 A1* | 4/2020 | Feng | H10B 12/0335 |
| 2020/0185023 A1* | 6/2020 | Onuki | G11C 5/025 |

FOREIGN PATENT DOCUMENTS

| | | |
|---|---|---|
| CN | 107017245 A | 8/2017 |
| CN | 110391234 A | 10/2019 |
| CN | 110534517 A | 12/2019 |

OTHER PUBLICATIONS

English translation of the Written Opinion of the International Search Authority in the international application No. PCT/CN2021/079647, mailed on Jun. 16, 2021, 5 pgs.

Second Office Action of the Chinese application No. 202010216030.1, issued on Feb. 28, 2023, 8 pages.

International Search Report in the international application No. PCT/CN2021/079647, mailed on Jun. 15, 2021, 2 pgs.

First Office Action of the Chinese application No. 202010216030.1, issued on May 23, 2022, 15 pgs.

\* cited by examiner

BIT LINE STRUCTURE, MANUFACTURING METHOD THEREOF AND SEMICONDUCTOR MEMORY

CROSS-REFERENCE TO RELATED APPLICATION

This is a continuation application of International Patent Application No. PCT/CN2021/079647, filed on Mar. 9, 2021, which claims priority to Chinese Patent Application No. 202010216030.1, filed on Mar. 25, 2020 and entitled "Bit Line Structure and Semiconductor Memory". The disclosures of the International Patent Application No. PCT/CN2021/079647 and the Chinese Patent Application No. 202010216030.1 are incorporated by reference herein in their entireties.

TECHNICAL FIELD

The disclosure relates to a bit line structure, a manufacturing method thereof, and a semiconductor memory.

BACKGROUND

With the development of science and technology, people's requirement for a semiconductor technology is getting higher and higher, and the area of semiconductor devices is continuously reduced. Therefore, higher requirements are put forward for the precision and accuracy of a semiconductor manufacturing process. A semiconductor memory is a memory accessed by using a semiconductor circuit, where a Dynamic Random Access Memory (DRAM) is widely used in various fields with high storage speed and high integration level.

SUMMARY

According to various embodiments, a first aspect of this disclosure provides a bit line structure, which may include: a first bit line array and a second bit line array.

The first bit line array includes a plurality of first bit lines extending in a Y direction. The plurality of first bit lines may have a same length and be aligned and arranged in an X direction.

The second bit line array includes a plurality of second bit lines extending in the Y direction. The plurality of second bit lines may have a same length and be aligned and arranged in the X direction.

The first bit line array and the second bit line array may be not aligned in the X direction, and the X direction may be perpendicular to the Y direction.

According to various embodiments, a second aspect of this disclosure provides a semiconductor memory, which may include: a bit line structure as described above and a memory cell.

The memory cell includes a memory capacitor and a transistor. A gate of the transistor may be connected to a word line, a drain of the transistor may be connected to a bit line, and a source of the transistor may be connected to the memory capacitor.

A plurality of memory cells may be arranged in an array consisting of M rows and N columns, the memory cells in a same row may share one word line, the memory cells in a same column may share one bit line, the bit line may have the bit line structure, and both M and N may be positive integers.

According to various embodiments, a third aspect of this disclosure provides a manufacturing method of a bit line structure, which may include following operations.

A substrate is provided, an isolation structure and an active region being formed in the substrate.

An interlayer dielectric layer and a hard mask layer are formed on a surface of the substrate;

The hard mask layer is patterned, and the interlayer dielectric layer is etched through the patterned hard mask layer to form bit line contact grooves, in which the patterned hard mask layer has a pattern same as a pattern of bit lines.

The bit line contact grooves are filled with a conductive material to form first bit line contact structures and second bit line contact structures.

A bit line metal layer is formed on surfaces of the first bit line contact structure, the second bit line contact structure, and the interlayer dielectric layer, and the bit line metal layer is patterned to form a first bit line array and a second bit line array.

The details of one or more embodiments of this disclosure are set forth in the accompanying drawings and the description below. Other features and advantages of this disclosure will be apparent from the specification, the accompanying drawings, and the claims.

BRIEF DESCRIPTION OF THE DRAWINGS

To describe the technical solutions in the embodiments of this disclosure more clearly, the following briefly introduces the accompanying drawings required in the embodiments. It is apparent to those of ordinary skill in the art that the drawings in the following description are only some embodiments of this disclosure, and that other drawings may be obtained from these drawings without involving any inventive effort.

DETAILED DESCRIPTION

A DRAM includes a plurality of repeated memory cells. As the size of the DRAM is continuously reduced and the integration level is continuously improved, the feature size and the unit area of the DRAM are reduced. Therefore, the area of a bit line contact structure is correspondingly reduced, so that the contact resistance between the bit line contact structure and corresponding bit line is increased, which causes current flowing through the bit line too small, and therefore the sensing margin of the DRAM and the charge-discharge speed of a memory capacitor are reduced.

For ease of understanding of the disclosure, the disclosure will now be described more fully hereinafter with reference to the related accompanying drawings. Preferred embodiments of the disclosure are illustrated in the accompanying drawings. The disclosure may, however, be embodied in many different forms, and is not limited to the embodiments set forth herein. Rather, these embodiments are provided so that the disclosure will be more thorough and complete.

Unless defined otherwise, all technical and scientific terms used herein have the same meaning as commonly understood by those skilled in the art to which the disclosure belongs. The terms used herein in the specification of the disclosure are for the purpose of describing particular embodiments only and are not intended to be limiting of the disclosure. As used herein, the term "and/or" includes any and all combinations of one or more of the associated listed items.

Figure 1:
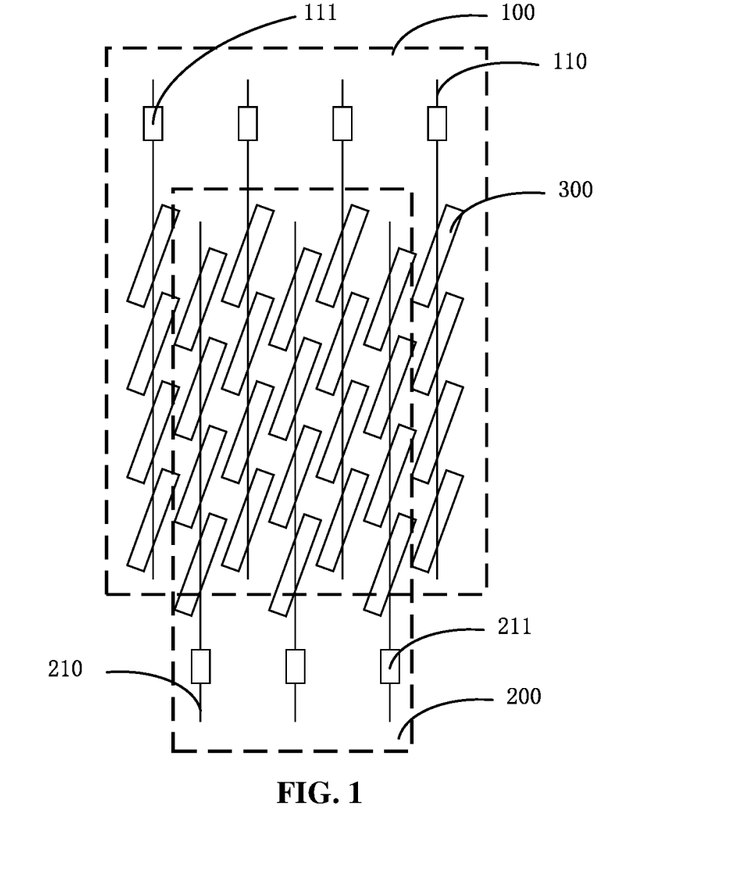
FIG. 1 is a schematic diagram of a bit line contact structure according to an embodiment.

FIG. 1 is a schematic diagram of a bit line contact structure according to an embodiment. As shown in FIG. 1, a bit line structure includes a first bit line array 100 and a second bit line array 200.

The first bit line array 100 includes a plurality of first bit lines 110 extending in a Y direction. The plurality of first bit lines 110 have a same length and are aligned and arranged in an X direction.

The second bit line array 200 includes a plurality of second bit lines 210 extending in the Y direction. The plurality of second bit lines 210 have a same length and are aligned and arranged in the X direction.

The first bit line array 100 and the second bit line array 200 are not aligned in the X direction. The X direction is perpendicular to the Y direction.

The fact that first bit line array 100 and the second bit line array 200 are not aligned in the X direction means that the first bit line array 100 and the second bit line array 200 are in different rows, i.e. a first axis of symmetry of the first bit line array 100 extending in the X direction does not coincide with a second axis of symmetry of the second bit line array 200 extending in the X direction. Specifically, both the first bit lines 110 and the second bit lines 210 are formed on a substrate, and a plurality of active regions 300 are disposed in the substrate. Each active region 300 is used to form a memory cell. Projections of each first bit line 110 and each second bit line 210 on the substrate pass through a plurality of active regions 300. The first bit lines 110 and the second bit lines 210 are used to transmit data written to and read from the memory cells.

As can be seen from FIG. 1, in the present embodiment, since the first bit line array 100 and the second bit line array 200 are not aligned in the X direction, a larger arrangement space is provided for the bit line contact structure, so that the cross-sectional area of the bit line contact structure can be enlarged, and thus the contact resistance between the bit line contact structure and the bit line can be reduced, and the sensing margin and the charge-discharge speed of a device can be increased. Meanwhile, the problem that the contact resistance is increased and even the device fails when the bit line contact structure is shifted from the bit line in the X direction is avoided. It needs to be noted that the cross-section in the present embodiment refers to a section parallel to the surface of the substrate, the cross-section in the following embodiment has the same definition as that in the present embodiment, and descriptions thereof are omitted.

Figure 2:
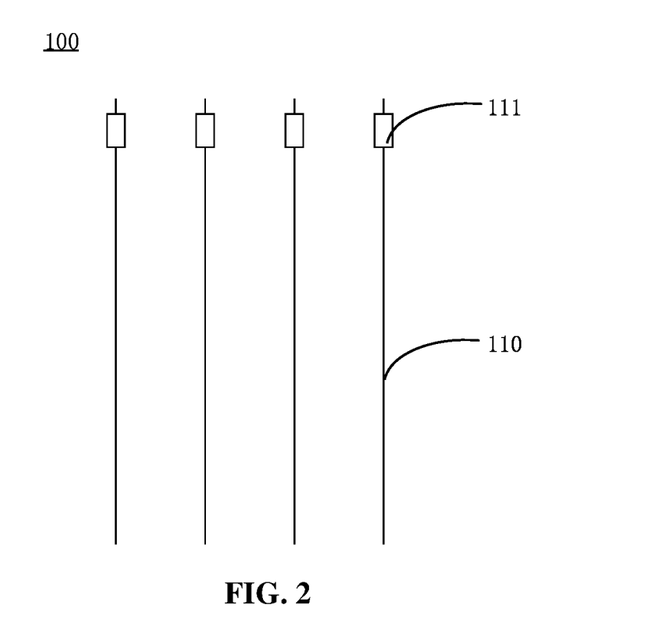
FIG. 2 is a schematic diagram of a first bit line array according to an embodiment.
Figure 3:
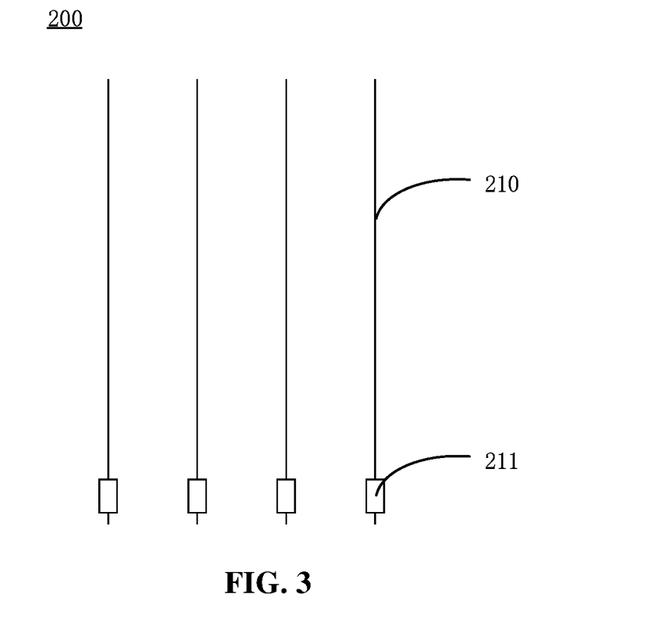
FIG. 3 is a schematic diagram of a second bit line array according to an embodiment.

In an embodiment, the plurality of first bit lines 110 are equidistantly arranged at a set interval in the X direction. The plurality of second bit lines 210 are equidistantly arranged at a set interval in the X direction. FIG. 2 is a schematic diagram of a first bit line array 100 according to the present embodiment. FIG. 3 is a schematic diagram of a second bit line array 200 according to the present embodiment. As shown in FIGS. 2 and 3, providing a plurality of equidistantly arranged first bit lines 110 and a plurality of equidistantly arranged second bit lines 210 can allow the first bit lines 110 and the second bit lines 210 to be adapted to regularly-aligned active regions. Meanwhile, when the arrangement interval of the first bit lines 110 is the same as the arrangement interval of the second bit lines 210, the active regions connected to the first bit lines 110 and the active regions connected to the second bit lines 210 may be more compatibly arranged on the substrate, thereby reducing the design difficulty and the processing difficulty of the active regions, the first bit lines 110, and the second bit lines 210.

In an embodiment, as shown in FIG. 1, the plurality of first bit lines 110 and the plurality of second bit lines 210 are spaced apart from each other in the X direction. That is, two bit lines adjacent to each first bit line 110 are second bit lines 210, and two bit lines adjacent to each second bit line 210 are first bit lines 110. Compared with the first bit lines 110 and the second bit lines 210 which are not spaced apart from each other, the present embodiment improves the bit line distribution density in the bit line structure, thereby reducing the device area occupied by the bit line structure in the X direction, further improving the integration level of a semiconductor device, and reducing the area of the semiconductor device.

In an embodiment, as shown in FIG. 2, the plurality of first bit lines 110 have first bit line contact structures 111 on a positive side of the Y direction. As shown in FIG. 3, the plurality of second bit lines 210 have second bit line contact structures 211 on a negative side of the Y direction. In another embodiment, the plurality of first bit lines 110 have first bit line contact structures 111 on a negative side of the Y direction. The plurality of second bit lines 210 have second bit line contact structures 211 on a positive side of the Y direction.

Therefore, in the above-described two embodiments in which the first bit line contact structure 111 and the second bit line contact structure 211 are respectively disposed on different sides of the corresponding bit lines, it is possible to provide a larger arrangement space for each first bit line contact structure 111 and each second bit line contact structure 211, thereby more effectively reducing the contact resistance of each bit line contact structure. Further, based on the bit line structure of the present embodiment, the sizes of the first bit line contact structure 111 and the second bit line contact structure 211 in the X direction may be 1.2 to 2 times a minimum process size.

In an embodiment, the first bit line contact structure 111 and the second bit line contact structure 211 have a same cross-sectional area. By arranging the first bit line contact structure 111 and the second bit line contact structure 211 with the same cross-sectional area, the contact resistance between each bit line contact structure and the corresponding bit lines may be the same. When the contact resistances are the same, current flowing through each bit line is the same under the same condition, so that memory capacitors have a same charge-discharge speed, thereby avoiding the performance difference between different memory cells, and improving the reliability of overall performance of the device.

Figure 4:
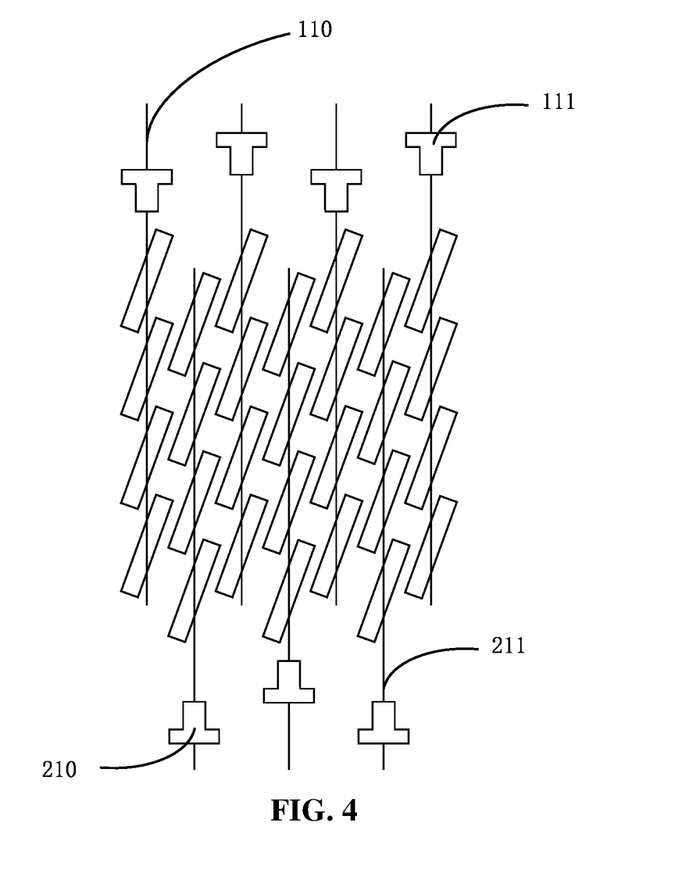
FIG. 4 is a schematic diagram of a T-shaped bit line contact structure according to an embodiment.
Figure 5:
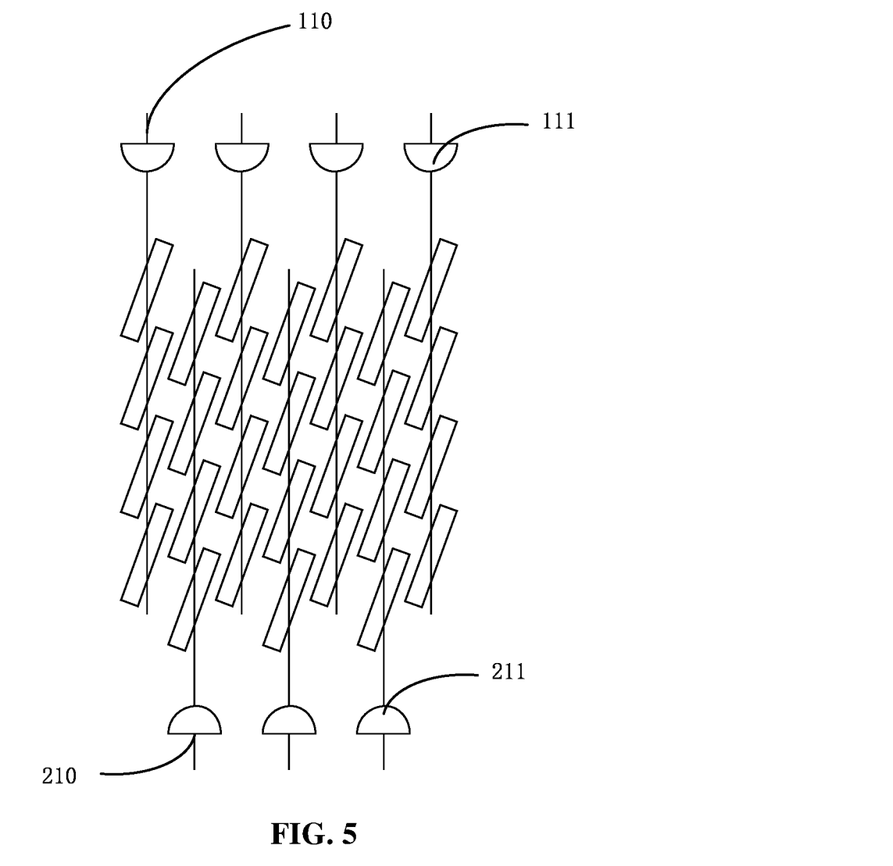
FIG. 5 is a schematic diagram of a semicircular bit line contact structure according to an embodiment.

In an embodiment, the first bit line contact structure 111 and the second bit line contact structure 211 each have a rectangular, T-shaped, or semicircular cross-section. The first bit line contact structure 111 and the second bit line contact structure 211 in the embodiment of FIG. 1 are rectangular bit line contact structures. FIG. 4 is a schematic diagram of a T-shaped bit line contact structure according to an embodiment. FIG. 5 is a schematic diagram of a semicircular bit line contact structure according to an embodiment. As shown in FIGS. 1, 4, and 5, the first bit line contact structure 111 and the second bit line contact structure 211 of any cross-sectional shape are suitable for the bit line structure. Therefore, the bit line contact structures of other cross-sectional shapes not shown in the present embodiment are also within the protection scope of the present embodiment.

Figure 6:
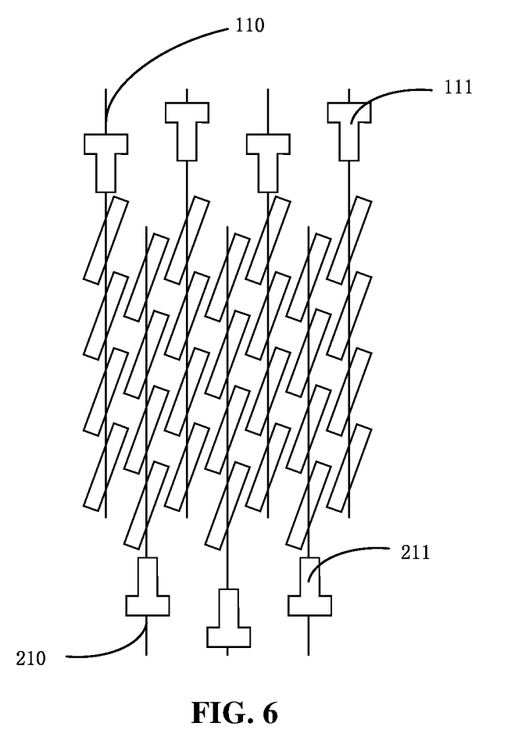
FIG. 6 is a schematic diagram of a word line structure with staggered bit line contact structures according to an embodiment.

FIG. 6 is a schematic diagram of a word line structure with staggered bit line contact structures according to an embodiment. As shown in FIG. 6, by elongating lengths of the first bit lines 110 in the present embodiment, a plurality of first bit line contact structures 111 are arranged in a staggered manner, thereby widening the arrangement space of the first bit line contact structures 111 in the Y direction, increasing the size of the first bit line contact structures 111 in the Y direction, enlarging the contact area between the first bit line contact structure 111 and the corresponding first bit line 110, and further reducing the contact resistance. Further, by elongating lengths of the second bit lines 210 in the present embodiment, a plurality of second bit line contact structures 211 are also arranged in a staggered manner. It needs to be noted that the staggered bit line contact structures necessarily cause the bit line structure to become larger in size in the Y direction, thereby requiring a larger device area to be occupied. Therefore, it is needed to select appropriate sizes of the first bit line contact structure 111 and the second bit line contact structure 211 in the Y direction to achieve the balance between the contact resistance and the device size.

Figure 7:
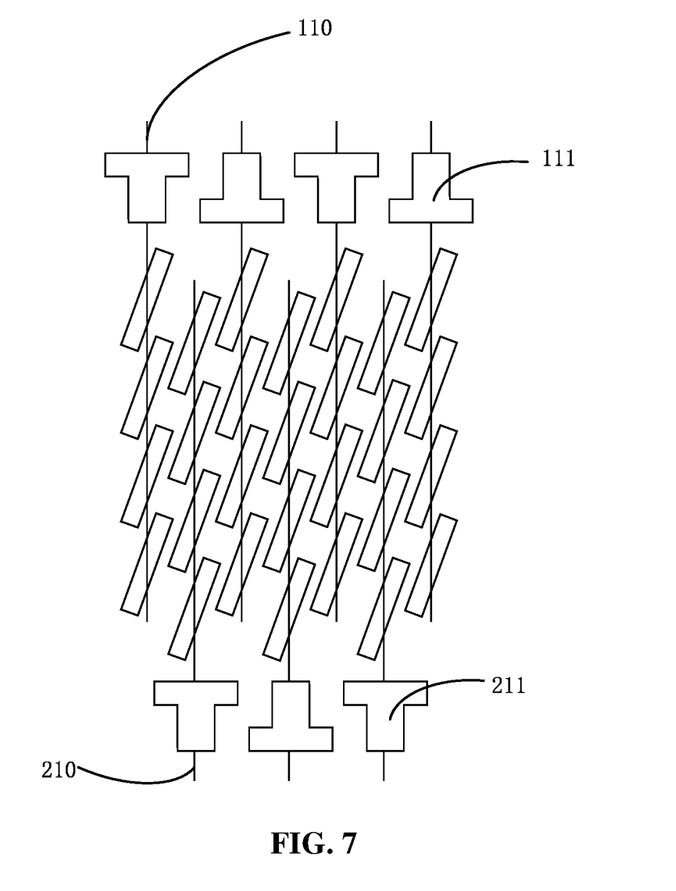
FIG. 7 is a schematic diagram of adjacent bit line contact structures having complementary shapes according to an embodiment.
Figure 8:
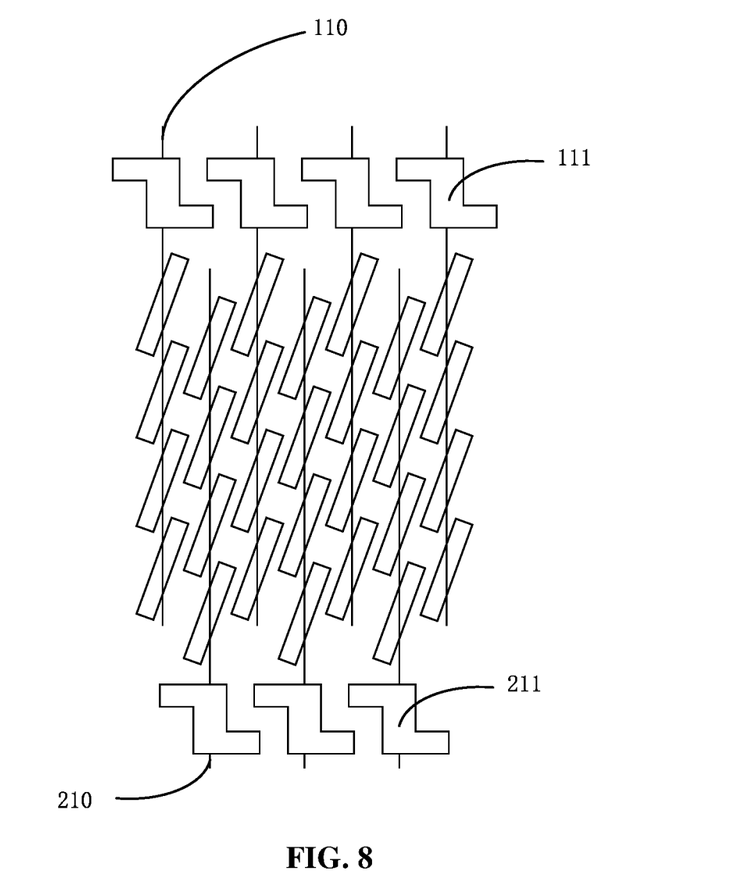
FIG. 8 is a schematic diagram of adjacent bit line contact structures having complementary shapes according to another embodiment.

FIG. 7 is a schematic diagram of adjacent bit line contact structures having complementary shapes according to an embodiment. In the present embodiment, the first bit line contact structures 111 are T-shaped, and adjacent T-shaped first bit line contact structures 111 are arranged in opposite directions. As shown in FIG. 7, on the premise that the first word line and the second word line have the same length, a first bit line contact structure 111 with a larger cross-sectional area may be achieved in the present embodiment by complementing the shapes of the adjacent T-shaped first bit line contact structures 111 to each other. Further, adjacent T-shaped second bit line contact structures 211 in the present embodiment are also arranged in opposite directions. It needs to be noted that the present embodiment does not specifically define the shapes and arrangement directions of the first bit line contact structure 111 and the second bit line contact structure 211. Other technical solutions capable of realizing shape complementation of adjacent bit line contact structures as shown in FIG. 8 are also within the protection scope of this disclosure.

In an embodiment, an end of each of the first bit line contact structure 111 and the second bit line contact structure 211 is electrically connected with a drain of a transistor, while an another end is electrically connected with a sense amplifier. The sense amplifier is used to read data from or write data to the memory cell.

Figure 9:
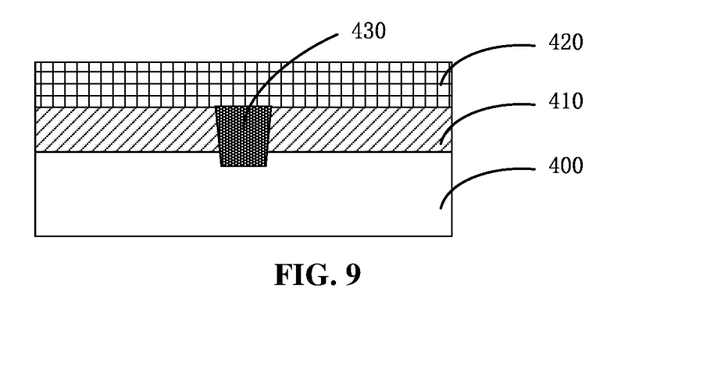
FIG. 9 is a schematic diagram of a grooved contact structure according to an embodiment.

In an embodiment, the first bit line contact structure 111 and/or the second bit line contact structure 211 are grooved contact structures. FIG. 9 is a schematic diagram of a grooved contact structure according to the present embodiment. As shown in FIG. 9, the grooved contact structure refers to a contact structure 430 formed by etching a bit line 400 with a set depth to form a groove and filling the groove with a conductive material. As such, a metal layer 420 is electrically connected with the bit line 400. By setting the first bit line contact structure 111 and/or the second bit line contact structure 211 as the grooved contact structures in the present embodiment, the area of the bit line contact structure can be reduced while a large contact area is ensured, and a contact and short circuit between adjacent contact structures are prevented, so that the integration level and reliability of the semiconductor device are improved.

In an embodiment, a material of the first bit line contact structure 111 and a material of the second bit line contact structure 211 each are one or more of tungsten, aluminum, copper, titanium, tantalum, or polysilicon. The above materials have good conductivity, thereby further reducing the contact resistance between the first bit line contact structure 111 and the corresponding bit line and the contact resistance between the second bit line contact structure 211 and the corresponding bit line.

Figure 10:
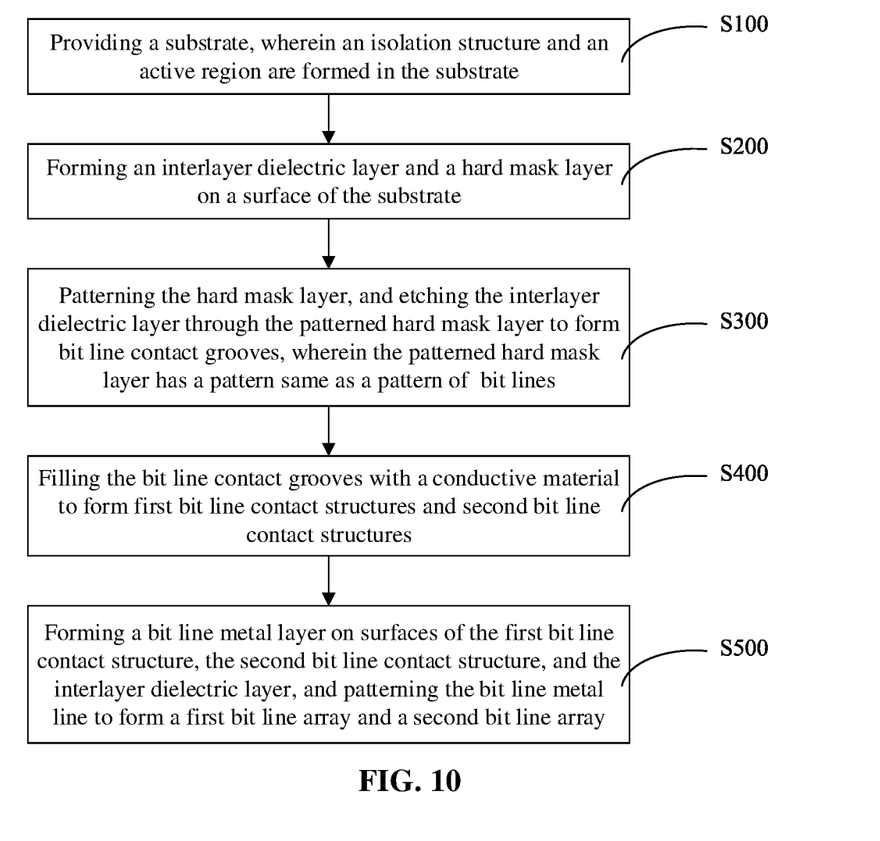
FIG. 10 shows a manufacturing method of a bit line structure according to an embodiment.

FIG. 10 shows a manufacturing method of a bit line structure according to an embodiment. As shown in FIG. 10, the manufacturing method of a bit line structure includes steps S100 to S500.

At S100, a substrate is provided, where an isolation structure and an active region are formed in the substrate.

Specifically, the substrate may be a silicon substrate or a germanium substrate. The isolation structure is formed in the substrate and used to define the active region in the substrate. After the isolation structure is formed, the active region is formed in the substrate by ion implantation.

Alternatively, the isolation structure is a shallow-trench isolation structure. The step of forming the shallow-trench isolation structure is as follows. A trench is etched in the substrate. The trench is filled with a dielectric substance. A wafer surface is planarized by using a chemical mechanical polishing method. Herein, the trench is filled with a dielectric substance by adopting a chemical vapor deposition method, and a material of the dielectric substance is such as silicon oxide. The shallow-trench isolation structure has a small surface area, is compatible with a chemical mechanical polishing technology, can be suitable for requirements of smaller line width and higher integration level, and is a better isolation technology. It needs to be noted that the isolation structure in the present embodiment is not limited to the shallow-trench isolation structure, and other isolation structures capable of achieving isolation performance are also possible.

At S200, an interlayer dielectric layer and a hard mask layer are formed on a surface of the substrate.

Specifically, a material of the interlayer dielectric layer may be silicon nitride, silicon oxide, or silicon oxynitride. The interlayer dielectric layer is used to separate adjacent bit line contact structures. A material of the hard mask layer may be at least one of silicon oxide, silicon nitride, silicon carbide, silicon oxynitride, silicon carbonitride, or silicon oxycarbonitride. The hard mask layer is used as a mask for etching of the interlayer dielectric layer.

At S300, the hard mask layer is patterned, and the interlayer dielectric layer is etched through the patterned hard mask layer to form bit line contact grooves, in which the patterned hard mask layer has a pattern same as a pattern of bit lines.

Further, step S300 further includes forming a trench-type contact structure.

At S400, the bit line contact grooves are filled with a conductive material to form first bit line contact structures 111 and second bit line contact structures 211.

Specifically, the step of filling the bit line contact grooves with the conductive material includes the following operations. The conductive material is deposited in the bit line contact grooves to form conductive material layers, in which a top of the conductive material layer is higher than a top of the interlayer dielectric layer. The conductive material layers are planarized to remove the conductive material layers higher than the interlayer dielectric layer and the remaining hard mask layer. Remaining conductive material layers serves as the first bit line contact structures 111 and the second bit line contact structures 211.

At S500, a bit line metal layer is formed on surfaces of the first bit line contact structure 111, the second bit line contact structure 211, and the interlayer dielectric layer, and the bit line metal line is patterned to form a first bit line array 100 and a second bit line array 200.

The first bit line array 100 includes a plurality of first bit lines 110 extending in a Y direction. The plurality of first bit lines 110 have a same length and are aligned and arranged in an X direction. The second bit line array 200 includes a plurality of second bit lines 210 extending in the Y direction. The plurality of second bit lines 210 have a same length and are aligned and arranged in the X direction. The first bit line array 100 and the second bit line array 200 are not aligned in the X direction. The X direction is perpendicular to the Y direction. Alternatively, a material of the bit line metal layer may be one or more of tungsten, aluminum, titanium, tantalum, or polysilicon.

It needs to be understood that although the various steps in the flowchart of FIG. 10 are shown sequentially as indicated by the arrows, the steps are not necessarily performed sequentially as indicated by the arrows. Unless specifically stated otherwise herein, the steps are not performed in a strict order of limitation, and the steps may be performed in other orders. Moreover, at least a portion of the steps in FIG. 10 may include a plurality of sub-steps or stages that are not necessarily performed at the same time, but may be performed at different times, and the sub-steps or stages may be not necessarily performed sequentially, but may be performed in turn or alternately with at least a portion of other steps or the sub-steps or stages of other steps.

In an embodiment, a semiconductor memory is also provided, which includes:
a bit line structure as described above; and
a memory cell, including a memory capacitor and a transistor, in which a gate of the transistor is connected to a word line, a drain of the transistor is connected to a bit line, and a source of the transistor is connected to the memory capacitor.

A plurality of memory cells are arranged in an array consisting of M rows and N columns Memory cells in a same row share one word line. The memory cells in the same column share one bit line. The bit line has the bit line structure. Both M and N are positive integers.

The semiconductor memory of the present embodiment is based on the first bit line array 100 and the second bit line array 200 which are not aligned in the X direction. The cross-sectional areas of the first bit line contact structure 111 and the second bit line contact structure 211 are enlarged by providing a larger arrangement space in a horizontal plane for the first bit line contact structure 111 and the second bit line contact structure 211. Therefore, the contact resistance between the first bit line contact structure 111 and the corresponding bit line and the contact resistance between the second bit line contact structure 211 and the corresponding bit line are reduced, and the sensing margin and the charge-discharge speed of the semiconductor memory are improved.

In the description of the disclosure, it is understood that the terms "upper", "lower", "vertical", "horizontal", "inner", "outer", etc. indicate orientations or positional relationships based on that shown in the drawings. They are merely intended to facilitate describing the disclosure and to simplify the description rather than indicating or implying that the referenced device or element must have a particular orientation and be constructed and operated in a particular orientation, and are thus not to be construed as limiting the disclosure.

The technical features of the above-described embodiments may be combined arbitrarily. In order to simplify the description, all possible combinations of the technical features in the above embodiments are not described. However, as long as there is no conflict between these technical features, they should be considered to be within the scope of this specification.

The above embodiments describe only a few implementations of the disclosure, and are described specifically and in detail, but cannot therefore be construed to limit the scope of the disclosure. It is noted that those of ordinary skill in the art may further make several variations and improvements without departing from the conception of the disclosure, which fall within the protection scope of the disclosure. Therefore, the protection scope of the disclosure should be determined by the appended claims.

The invention claimed is:

1. A bit line structure, comprising:
a first bit line array, comprising a plurality of first bit lines extending in a Y direction, the plurality of first bit lines having a same length and being aligned and arranged in an X direction; and
a second bit line array, comprising a plurality of second bit lines extending in the Y direction, the plurality of second bit lines having a same length and being aligned and arranged in the X direction; and,
wherein the projection of the first bit line array and the projection of the second bit line array on a substrate are not aligned in the X direction, and the X direction is perpendicular to the Y direction;
the plurality of first bit lines and the plurality of second bit lines are spaced apart from each other in the X direction;
the plurality of first bit lines have first bit line contact structures on a positive side of the Y direction, and the plurality of second bit lines have second bit line contact structures on a negative side of the Y direction; or
the plurality of first bit lines have first bit line contact structures on a negative side of the Y direction, and the plurality of second bit lines have second bit line contact structures on a positive side of the Y direction.

2. The bit line structure of claim 1, wherein the plurality of first bit lines are equidistantly arranged at a set interval in the X direction, and the plurality of second bit lines are equidistantly arranged at a set interval in the X direction.

3. The bit line structure of claim 1, wherein the first bit line contact structure and the second bit line contact structure have a same cross-sectional area.

4. The bit line structure of claim 1, wherein the first bit line contact structure and the second bit line contact structure each have a rectangular, T-shaped, or semicircular cross-section.

5. The bit line structure of claim 4, wherein adjacent T-shaped first bit line contact structures are arranged in opposite directions.

6. The bit line structure of claim 5, wherein adjacent T-shaped second bit line contact structures are arranged in opposite directions.

7. The bit line structure of claim 1, wherein an end of each of the first bit line contact structure and the second bit line contact structure is electrically connected with a drain of a transistor and an another end of each of the first bit line contact structure and the second bit line contact structure is electrically connected with a sense amplifier.

8. The bit line structure of claim 1, wherein at least one of the first bit line contact structure and the second bit line contact structure is a grooved contact structure.

9. The bit line structure of claim 1, wherein a material of the first bit line contact structure and a material of the second bit line contact structure each are one or more of tungsten, aluminum, copper, titanium, tantalum, or polysilicon.

10. A semiconductor memory, comprising:
a bit line structure comprising:
a first bit line array, comprising a plurality of first bit lines extending in a Y direction, the plurality of first bit lines having a same length and being aligned and arranged in an X direction; and
a second bit line array, comprising a plurality of second bit lines extending in the Y direction, the plurality of second bit lines having a same length and being aligned and arranged in the X direction,
wherein the projection of the first bit line array and the projection of the second bit line array on a substrate are not aligned in the X direction, and the X direction is perpendicular to the Y direction; and
a memory cell, comprising a memory capacitor and a transistor, a gate of the transistor being connected to a word line, a drain of the transistor being connected to a bit line, and a source of the transistor being connected to the memory capacitor; and, wherein
wherein a plurality of memory cells are arranged in an array consisting of M rows and N columns, the memory cells in a same row share one word line, the memory cells in a same column share one bit line, the bit line has the bit line structure, and both M and N are positive integers;
the plurality of first bit lines and the plurality of second bit lines are:
spaced apart from each other in the X direction;
have first bit line contact structures on a positive side of the Y direction, and the plurality of second bit lines have second bit line contact structures on a negative side of the Y direction; or
have first bit line contact structures on a negative side of the Y direction, and the plurality of second bit lines have second bit line contact structures on a positive side of the Y direction.

11. A manufacturing method of a bit line structure, comprising:
providing a substrate, an isolation structure and an active region being formed in the substrate;
forming an interlayer dielectric layer and a hard mask layer on a surface of the substrate;
patterning the hard mask layer, and etching the interlayer dielectric layer through the patterned hard mask layer to form bit line contact grooves, wherein the patterned hard mask layer has a pattern same as a pattern of bit lines;
filling the bit line contact grooves with a conductive material to form first bit line contact structures and second bit line contact structures; and
forming a bit line metal layer on surfaces of the first bit line contact structure, the second bit line contact structure, and the interlayer dielectric layer, and patterning the bit line metal layer to form a first bit line array and a second bit line array; and
wherein the filling the bit line contact grooves with the conductive material comprises:
depositing the conductive material in the bit line contact grooves to form conductive material layers, wherein a top of the conductive material layer is higher than a top of the interlayer dielectric layer; and
planarizing the conductive material layers to remove the conductive material layers higher than the interlayer dielectric layer and the remaining hard mask layer, remaining conductive material layers serving as the first bit line contact structures and the second bit line contact structures,
wherein the first bit line array comprises a plurality of first bit lines extending in a Y direction, the plurality of first bit lines having a same length and being aligned and arranged in an X direction, and the second bit line array comprises a plurality of second bit lines extending in the Y direction, the plurality of second bit lines having a same length and being aligned and arranged in the X direction, and wherein the projection of the first bit line array and the projection of the second bit line array on a substrate are not aligned in the X direction, and the X direction is perpendicular to the Y direction; and
the plurality of first bit lines and the plurality of second bit lines:
are spaced apart from each other in the X direction;
contact structures on a positive side of the Y direction, and the plurality of second bit lines have second bit line contact structures on a negative side of the Y direction; or
have first bit line contact structures on a negative side of the Y direction, and the plurality of second bit lines have second bit line contact structures on a positive side of the Y direction.

12. The manufacturing method of claim 11, wherein the forming the isolation structure comprises:
etching a trench in the substrate;
filling the trench with a dielectric substance; and
planarizing a wafer surface by using a chemical mechanical polishing method.

13. The manufacturing method of claim 11, wherein a material of the interlayer dielectric layer is silicon nitride, silicon oxide, or silicon oxynitride.

14. The manufacturing method of claim 11, wherein a material of the hard mask layer is at least one of silicon oxide, silicon nitride, silicon carbide, silicon oxynitride, silicon carbonitride, or silicon oxycarbonitride.

15. The manufacturing method of claim 11, wherein a material of the bit line metal layer is one or more of tungsten, aluminum, titanium, tantalum, or polysilicon.

* * * * *